(12) United States Patent
White et al.

(10) Patent No.: US 7,985,627 B2
(45) Date of Patent: *Jul. 26, 2011

(54) THERMAL INTERMEDIATE APPARATUS, SYSTEMS, AND METHODS

(75) Inventors: Bryan M. White, Katy, TX (US); Paul A. Koning, Chandler, AZ (US); Yuegang Zhang, Cupertino, CA (US); C. M. Garner, Pleasanton, CA (US)

(73) Assignee: Intel Corporation, Santa Clara, CA (US)

( * ) Notice: Subject to any disclaimer, the term of this patent is extended or adjusted under 35 U.S.C. 154(b) by 261 days.

This patent is subject to a terminal disclaimer.

(21) Appl. No.: 12/277,075

(22) Filed: Nov. 24, 2008

(65) Prior Publication Data

US 2009/0075430 A1   Mar. 19, 2009

Related U.S. Application Data

(62) Division of application No. 10/748,565, filed on Dec. 30, 2003, now Pat. No. 7,456,052.

(51) Int. Cl.
*H01L 21/00* (2006.01)

(52) U.S. Cl. ........ 438/122; 438/121; 438/107; 257/713; 257/E21.499; 977/742; 977/732

(58) Field of Classification Search .............. 438/121, 438/107, 122; 257/713, E21.499; 977/742, 977/932

See application file for complete search history.

(56) References Cited

U.S. PATENT DOCUMENTS

| 4,169,911 | A | 10/1979 | Yoshida et al. |
| 5,102,824 | A | 4/1992 | Neugebauer et al. |
| 5,316,080 | A | 5/1994 | Banks et al. |
| 5,580,512 | A | 12/1996 | Koon et al. |
| 5,604,037 | A | 2/1997 | Ting et al. |
| 5,825,624 | A | 10/1998 | Arnold et al. |
| 5,837,081 | A | 11/1998 | Ting et al. |
| 5,904,977 | A | 5/1999 | Reitz |
| 5,965,257 | A | 10/1999 | Ahluwalia |
| 5,965,267 | A | 10/1999 | Nolan et al. |
| 5,972,265 | A | 10/1999 | Marra et al. |
| 6,312,303 | B1 | 11/2001 | Yaniv et al. |
| 6,407,922 | B1 | 6/2002 | Eckblad et al. |
| 6,504,292 | B1 | 1/2003 | Choi et al. |
| 6,630,772 | B1 | 10/2003 | Bower et al. |

(Continued)

FOREIGN PATENT DOCUMENTS

CN          1318511       10/2001

(Continued)

OTHER PUBLICATIONS

Andrews, R., et al., "Nanotube Composite Carbon Fibers", *Applied Physics Letters*, 75(9), (Aug. 30, 1999), 1329-1331.

(Continued)

*Primary Examiner* — Junghwa M Im
(74) *Attorney, Agent, or Firm* — Schwegman, Lundberg & Woessner, P.A.

(57) ABSTRACT

Apparatus and system, as well as fabrication methods therefor, may include a thermal intermediate structure comprised of a plurality of carbon nanotubes some of which have organic moieties attached thereto to tether the nanotubes to at least one of a die and a heat sink. The organic moieties include thiol linkers and amide linkers.

5 Claims, 4 Drawing Sheets

U.S. PATENT DOCUMENTS

| | | |
|---|---|---|
| 6,651,736 B2 | 11/2003 | Chiu et al. |
| 6,856,016 B2 | 2/2005 | Searls et al. |
| 6,891,724 B2 | 5/2005 | De Lorenzo et al. |
| 6,921,462 B2 | 7/2005 | Montgomery et al. |
| 6,924,211 B2 | 8/2005 | Yamazaki et al. |
| 6,989,325 B2 | 1/2006 | Uang et al. |
| 7,109,581 B2 | 9/2006 | Dangelo et al. |
| 7,168,484 B2 | 1/2007 | Zhang et al. |
| 7,180,174 B2 | 2/2007 | Koning et al. |
| 7,456,052 B2 * | 11/2008 | White et al. .......... 438/122 |
| 7,704,462 B2 | 4/2010 | Montgomery et al. |
| 2002/0105071 A1 | 8/2002 | Mahajan et al. |
| 2002/0117659 A1 | 8/2002 | Lieber et al. |
| 2002/0175408 A1 | 11/2002 | Majumdar et al. |
| 2003/0077478 A1 | 4/2003 | Dani et al. |
| 2003/0117770 A1 | 6/2003 | Montgomery |
| 2003/0135971 A1 | 7/2003 | Liberman et al. |
| 2003/0179559 A1 | 9/2003 | Engelhardt et al. |
| 2003/0231471 A1 | 12/2003 | De Lorenzo et al. |
| 2004/0005736 A1 | 1/2004 | Searls et al. |
| 2004/0150100 A1 | 8/2004 | Dubin et al. |
| 2004/0152240 A1 | 8/2004 | Dangelo |
| 2004/0164390 A1 | 8/2004 | Wang |
| 2004/0261987 A1 | 12/2004 | Zhang et al. |
| 2004/0265489 A1 | 12/2004 | Dubin |
| 2005/0093120 A1 | 5/2005 | Millik et al. |
| 2005/0126766 A1 | 6/2005 | Lee et al. |
| 2005/0139642 A1 | 6/2005 | Koning et al. |
| 2005/0139991 A1 | 6/2005 | White et al. |
| 2005/0260453 A1 | 11/2005 | Jiao et al. |
| 2006/0054490 A1 | 3/2006 | Montgomery et al. |
| 2007/0119582 A1 | 5/2007 | Zhang et al. |

FOREIGN PATENT DOCUMENTS

| | | |
|---|---|---|
| EP | 0538798 | 4/1993 |
| EP | 0689244 | 12/1995 |
| EP | 1054036 | 11/2000 |
| EP | 1109218 | 6/2001 |
| WO | WO-00/33628 | 6/2000 |
| WO | WO-01/30694 | 5/2001 |
| WO | WO-01/92381 | 12/2001 |

OTHER PUBLICATIONS

Bellar, R J, et al., "High Conduction Thermal Interface Material", *IBM Technical Disclosure Bulletin*, 36 (10), (Oct. 1, 1993), 581-584.

Zhang, Y., et al., "Formation of metal nanowires on suspended single-walled carbon nanotubes", *Applied Physics Letters*, 77(19), (Nov. 6, 2000), 3015-3017.

* cited by examiner

THERMAL INTERMEDIATE APPARATUS, SYSTEMS, AND METHODS

RELATED APPLICATION

This application is a Divisional of U.S. application Ser. No. 10/748,565, filed Dec. 30, 2003 now U.S. Pat. No. 7,456,052, which is incorporated herein its entirety.

TECHNICAL FIELD

The subject matter relates generally to apparatus, systems, and methods used to assist in transferring heat from one element or body, such as a circuit, to another, such as a heat sink.

BACKGROUND INFORMATION

Electronic components, such as integrated circuits, may be assembled into component packages by physically and electrically coupling them to a substrate. During operation, the package may generate heat which can be dissipated to help maintain the circuitry at a desired temperature. Heat sinks, including heat spreaders, may be coupled to the package using a suitable thermal interface to assist in transferring heat from the package to the heat sink.

DETAILED DESCRIPTION

Figure 1:
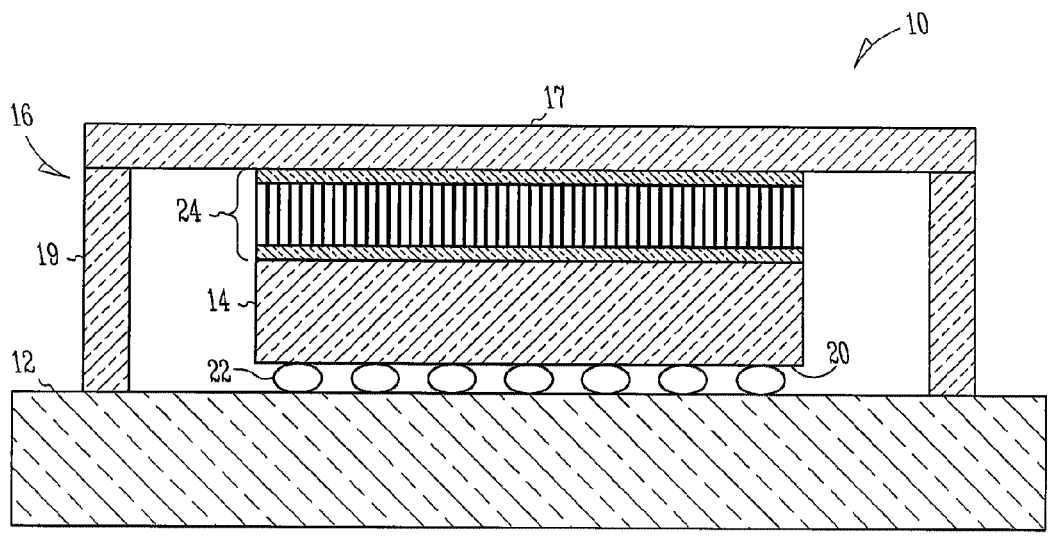
FIG. 1 is a cross-section view of an apparatus according to various embodiments.

In the following detailed description of various embodiments, reference is made to the accompanying drawings that form a part hereof, and in which are shown by way of illustration, and not of limitation, specific embodiments in which the subject matter may be practiced. In the drawings, like numerals describe substantially similar components throughout the several views. The embodiments illustrated are described in sufficient detail to enable those skilled in the art to practice the teachings disclosed herein. Other embodiments may be utilized and derived therefrom, such that compositional, structural, and logical substitutions and changes may be made without departing from the scope of this disclosure.

Examples and embodiments merely typify possible variations. Individual components and functions are optional unless explicitly required, and the sequence of operations may vary. Portions and features of some embodiments may be included in or substituted for those of others. The following detailed description is, therefore, not to be taken in a limiting sense.

FIG. 1 is a cross section view of an apparatus 10 according to an embodiment. Apparatus 10 includes a substrate 12, an electronic circuit die 14 and a thermal management aid such as a heat sink or an integral heat spreader 16 which is mounted adjacent the die 14 and separated from it by a gap 17, which has a height h.

In one embodiment, the substrate of die 14 is silicon and has front side and backside surfaces. The die 14 also has at least one integrated circuit 20 and solder bump contacts 22 on at least its front side surface. The contacts 22 connect with contact pads (not shown) on the upper surface of package substrate 12. In an embodiment, the contacts 22 are manufactured according to a commonly used controlled collapse chip connect (C4) process.

In use, electric signals and power are provided to the integrated circuit 20 through contacts 20, for example. Operation of the integrated circuit 20 causes heating of die 14. Heat is transferred from components of the integrated circuit 20 through to the body of die 14. In order to move heat away from die 14, it is conducted to the heat spreader 16 through a thermal intermediate structure 24 interposed in the gap 17 between them to provide a low resistance thermal path for heat generated in die 14 to heat spreader 16.

In FIG. 1, the heat spreader 16 includes a top plate 18 and supporting side walls 19. In an embodiment the side walls 19 completely surround the die 14. In an embodiment, the heat spreader 16 is coupled to a further heat sink (not shown) which may or may not be actively cooled.

In an embodiment, the thermal interface structure 24 comprises a plurality 25 of either densely packed multi-walled or single walled carbon nanotubes 25 or a combination of both single and double walled nanotubes. Carbon nanotubes 25 have a coefficient of thermal conductivity along their longitudinal axis which is relatively high relative to their conductivity along a path oriented orthogonal to the longitudinal axis. The thermal conductivity of carbon nanotubes along their longitudinal axes is substantially higher than that of other materials used for thermal intermediates. The thermal conductivity of multi-walled nanotubes is about 3000 to 4000 W/m-K. The conductivity is about 6000 W/m-K for single walled nanotubes.

In an embodiment, either the heat spreader 16 or a lower surface of top plate 18 thereof, is formed of, or coated with, gold, a gold alloy or silver or a silver alloy coating 26 prior to growing the plurality of carbon nanotubes 25. In an embodiment, one or both of layers 26 and 30 is a layer comprising crystalline gold, Au (111).

In an embodiment, nanotubes 25 may be grown by known methods such as arc discharge, laser ablation or catalytic chemical ablation. Those processes produce extended strands of carbon nanotubes, in both single walled and double walled states, arranged in randomly tangled nanotube ropes.

In one embodiment, the nanotubes are organized 25 or manipulated to produce well-ordered arrays for use in thermal intermediate structures 34. In one embodiment long ropes of carbon nanotubes can cut into short lengths of open-ended nanotubes by oxidation in concentrated sulfuric and nitric acids and functionalized to facilitate bonding to a the ends to a surface. Such shortened nanotubes 25 are believed to be open-ended and carboxyl terminated after the above oxidation treatment.

In an embodiment, the carboxyl terminated carbon nanotubes are to be tethered to a gold surface by Au—S chemical bonding. Certain linking organic chemical moieties having thiol and amide linkers facilitate the forming of a tether or a chemical bond between an end of the nanotubes and the gold surface. The tethering process is carried out, in an embodiment, after the carboxyl terminated short carbon nanotubes are thiol derivatized by reacting with $(CH_2)_2$—SH while in a suspension such as an ethanol suspension and may also be aided by the presence of a condensation agent such as dicyclohexylcarbodiimide.

Figure 2A:
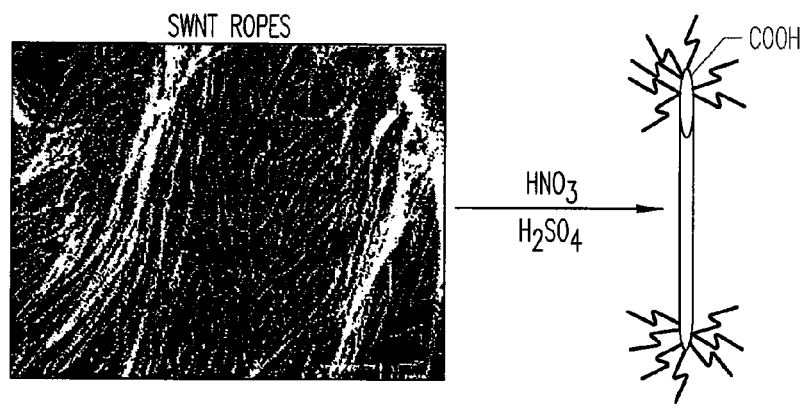
FIG. 2 is a schematic illustration of the functionalization process used to apply linking organic moieties to the carbon nanotubes.
Figure 2B:
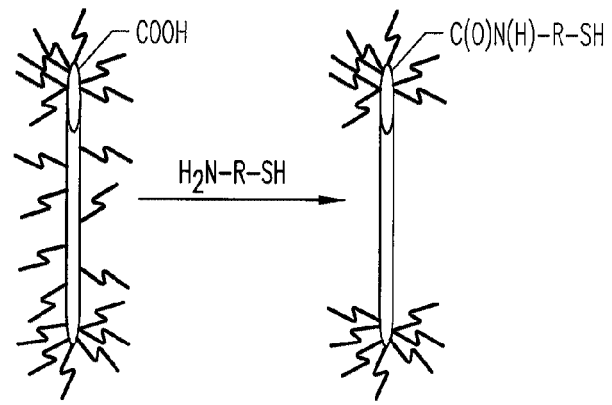

In FIGS. 2A and 2B a schematic view of the treatment of a nanotube rope is shown. In a first process, in FIG. 2A, the nanotube ropes are oxidized in a solution of nitric and sulfuric acid. A shortened nanotube 25 with carboxyl groups 29 attached to at least the ends thereof is shown following the first process. In a second process, shown in FIG. 2B, the shortened nanotubes 25 with carboxyl groups is reacted with $H_2N$—R—SH. The resultant product shown in FIG. 2B has short nanotubes tipped with linking organic moieties including amide and thiol linkers. As part of the process linking organic moieties tether one end of some of the carbon nanotubes 25 to a gold surface 26, 30.

After tethering the ends of the nanotubes 25 to the gold surface, the resultant product, in one embodiment, is a self-assembled monolayer of thiol functionalized nanotubes. The thiol-functionalized nanotubes are immobilized on the gold layer by Au—S chemical bonding with many of the nanotubes perpendicularly standing on the surface of the gold layer. In an embodiment, an amide linker is also present, to facilitate the linking of the nanotubes 25 to the thiol which links to the gold surface. The short carbon nanotubes which have linking organic moieties attached to them are thus chemically bonded to the gold surface. In an embodiment, the ends of the nanotubes are tethered to the surface. They are tethered at their ends rather than along their longitudinal axes since the thiol and amide bonds form primarily at the ends of the nanotubes 25.

Substantial alignment of the longitudinal axes of many nanotubes of the array of carbon nanotubes 25 perpendicular to the surface to which they are tethered occurs so that they are oriented substantially perpendicular to the surface of die 14 to provide a direct thermal path with low thermal resistance between die 14 and heat spreader 16.

In one embodiment, the lengths of the nanotubes thus formed may be in the range of at least about 10 nanometers. In another embodiment, the nanotubes can be in the range of 500 to 10,000 nm long. And most commonly 500 to 5000 nm long. In one embodiment, the diameters of the single walled nanotubes can be expected to be in the range of about 0.8 to 4 nm and multi-walled nanotubes in the range of 10 to 100 nm. In one embodiment, the nanotubes can also be expected to form into aggregates or bundles where those nanotubes initially bonding to the gold surface then serve as nucleation sites for further bonding to unattached tubes in the liquid suspension of nanotubes.

Figure 3:
FIGS. 3-5 are illustrations of various thermal intermediate structure embodiments.
Figure 3:
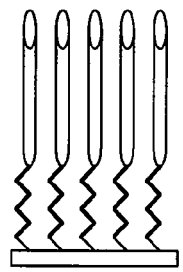

In some embodiments shown in FIG. 3, a gold coating 26 is applied to the surface of die 14. A set of nanotubes 25 is attached by a thiol based tether to die 14. In an embodiment the other ends of the attached nanotubes 25 are brought into contact with the surface of top plate 18 of heat spreader 16 and form a thermal coupling by the mechanical contact of the ends of the nanotubes and the surface. The chemical bond to the die is facilitated by organic moieties having amide linkers to form a bond to the nanotubes and having thiol linkers to facilitate linking nanotube ends to the surface of gold layer 26. In an embodiment, the gold layer 26 is crystalline gold with lattice orientation (1,1,1) i.e. Au (111). In an embodiment, the resulting nanotube thermal intermediate structure 24 has a height between about 1 and 25 microns.

Figure 4:
Figure 4:
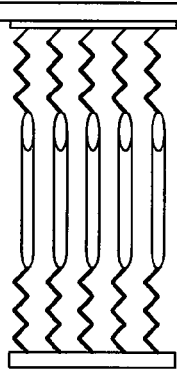

In some embodiments, shown in FIG. 4, a plurality of nanotubes 25 is shown with both ends of the nanotubes 26 treated with linking organic moieties to form thiol-links and amide links to the gold 26, 30 and the nanotubes 25 respectively. In an embodiment, as shown in FIG. 4, the height of the thermal intermediate structure 24 is about one to 25 microns. The thermal intermediate structure of the embodiments shown in FIG. 4 would be expected to provide good thermal interfaces between the nanotubes and the surfaces to which they are tethered than the one illustrated in FIG. 3. Tethering of the nanotubes to both the heat spreader and the die would be expected to reduce the thermal resistance of the overall heat flow path.

Figure 5:
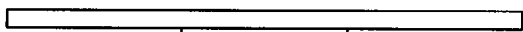
Figure 5:
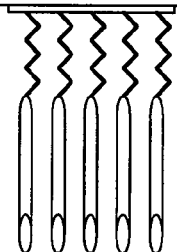
Figure 5:
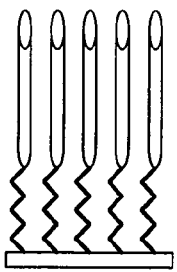

In some embodiments, shown in FIG. 5, the thermal intermediate portion 24A is formed by depositing one layer of nanotubes on the surface of die 14 and another portion 24B on the surface of heat spreader 16. The tethering of the nanotubes to the surfaces is again through the use of linking organic moieties with amide linkers and thiol-linkers, as discussed above. In some embodiments, the thickness of each of the two portions 24A and 24B of the thermal intermediate structure ranges from about 2 to 50 microns. After the two portions 24A, 24B of the thermal intermediate structure 24 are formed on the two opposing surfaces of the die 14 and the heat spreader 16, the die and heat spreader are brought together and the free ends of the two portions 24A and 24B are structurally joined into thermal intermediate structure 24.

Figure 6:
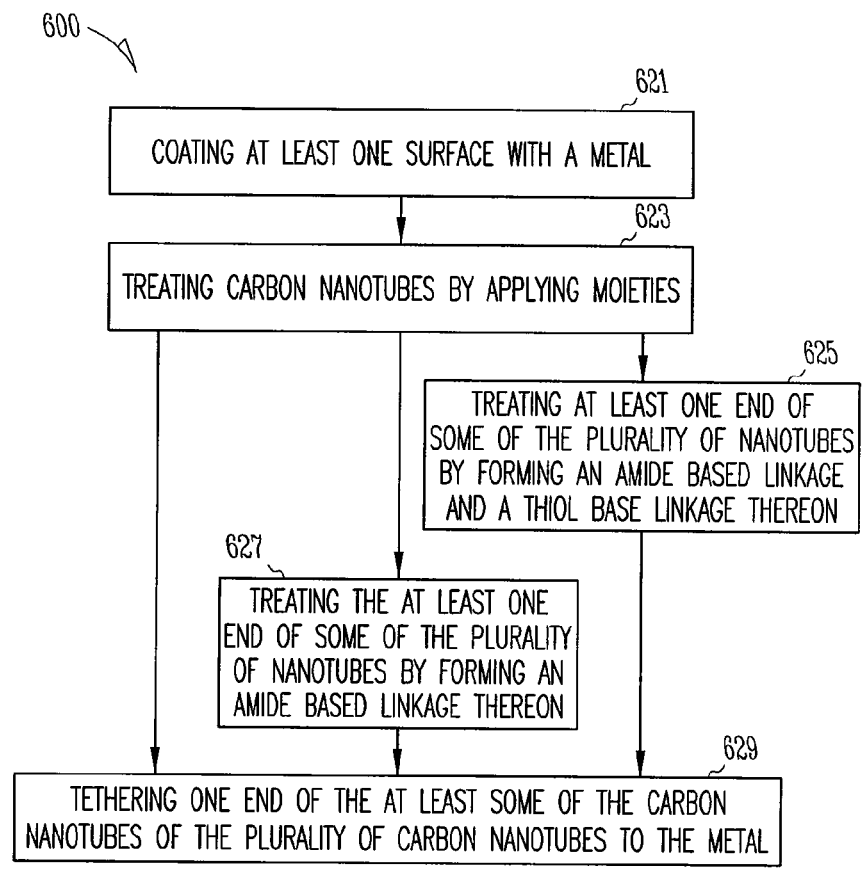
FIGS. 6 and 7 illustrate a process and a method embodiment.

FIG. 6 is a flow chart illustrating several methods according to an embodiment. Thus, a method 611 may (optionally) begin at block 621 with coating at least one surface of least one of a heat sink and of a die with a metal and, at block 623, treating at least one end of at least some of a plurality of carbon nanotubes by applying organic moieties thereto. In an embodiment, the metal is gold or a gold alloy.

Figure 7:
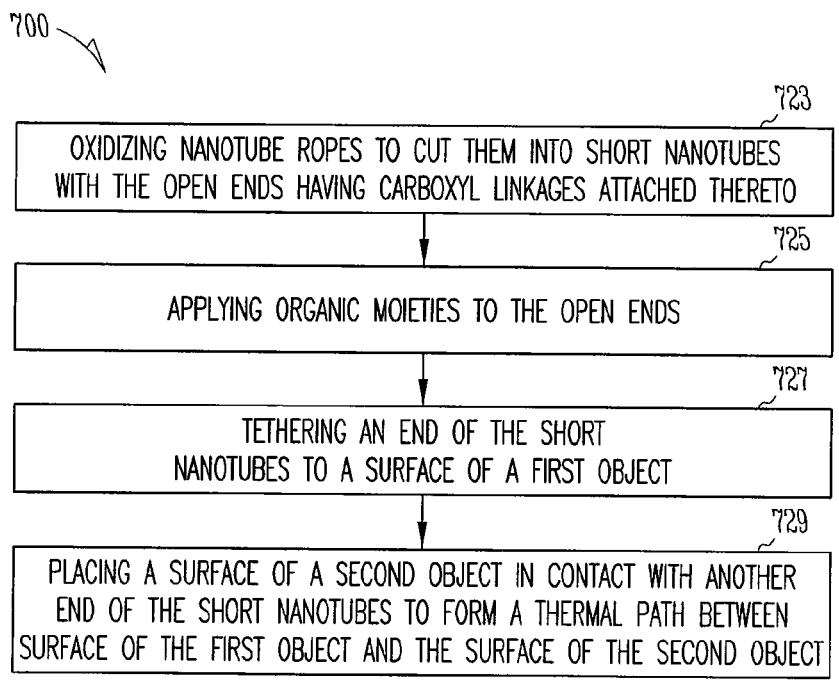

At block 625, in an embodiment, the applying moieties process includes treating the at least one end of some of the plurality of nanotubes by forming an amide based linkage and a thiol based linkage thereon. In an alternative step 627 (optional), the applying moieties includes treating the at least one end of some of the plurality of nanotubes by forming an amide based linkage thereon. In some embodiments, a further step 629 is tethering one end of the at least some of the carbon nanotubes of the plurality of carbon nanotubes to the metal In a method embodiment illustrated in FIG. 7, a process 700 comprises, in block 723 oxidizing the nanotubes ropes in acid to cut them into short nanotubes with open ends having carboxyl linkages attached thereto. In block 725 the process includes applying organic linking moieties at the open ends. In an embodiment, the organic moieties comprise an amide linker. In an embodiment the organic moieties also comprise a thiol linker. In an embodiment, the organic moieties comprise a thiol linker and an amide linker.

In an embodiment, a block 727 comprises tethering an end of the short nanotubes to a surface of a first object. In an embodiment, a block 729 comprises placing a surface of a second object in contact with another end of the short nanotubes to form a thermal path between surface of the first object and the surface of the second object.

Figure 8:
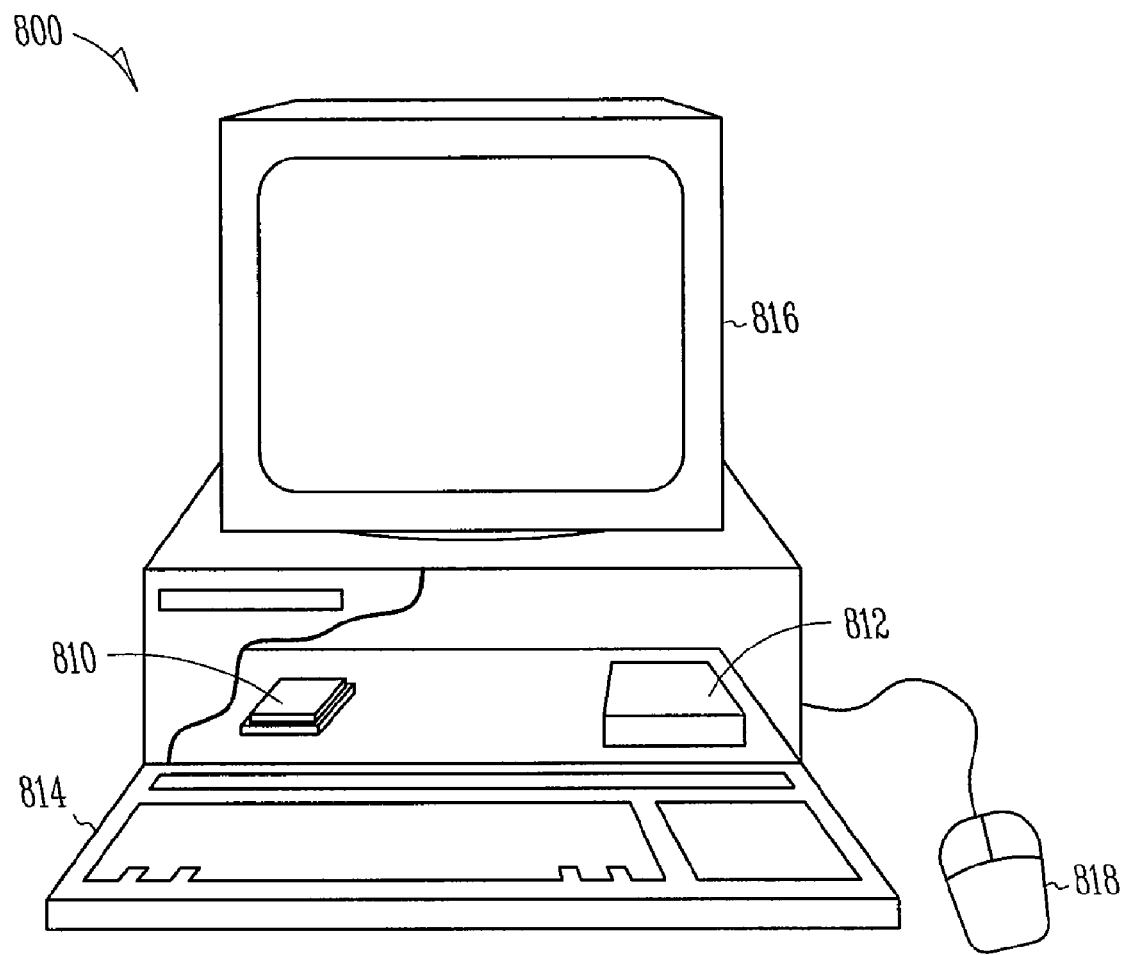
FIG. 8 is a depiction of a computing system according to an embodiment.

FIG. 8 is a depiction of a computing system according to an embodiment. One or more of the embodiments of apparatus with one or more dies having a thermal intermediate structure comprising a plurality of carbon nanotubes, some of which are tethered to at least one of the die and the heat sink with a thermal interface may be used in a computing system such as a computing system 00 of FIG. 8. The computing system 700 includes at least one processor (not pictured), which is enclosed in a microelectronic device package 810, a data storage system 812, at least one input device such as a keyboard 814, and at least one output device such as a monitor 816, for example. The computing system 800 includes a processor that processes data signals, and may include, for example, a microprocessor available from Intel Corporation.

In addition to the keyboard 814, an embodiment of the computing system includes a further user input device such as a mouse 818, for example.

For the purposes of this disclosure, a computing system 800 embodying components in accordance with the claimed subject matter may include any system that utilizes a microelectronic device package, which may include, for example, a data storage device such as dynamic random access memory, polymer memory, flash memory and phase change memory. The microelectronic device package can also include a die that contains a digital signal processor (DSP), a micro-controller, an application specific integrated circuit (ASIC), or a microprocessor.

Embodiments set forth in this disclosure can be applied to devices and apparatus other than a traditional computer. For example, a die can be packaged with an embodiment of the thermal interface material and buffer layer, and placed in a portable device such as a wireless communicator or a hand held device such as a personal data assistant or the like. Another example is a die that can be coupled to a heat sink with an embodiment of the thermal interface material and buffer layer and placed in a dirigible craft such as an automobile, a watercraft, an aircraft or a spacecraft.

The apparatus 10, substrate 12, die 14, heat spreader 16, integrated circuit 20, solder bumps 22 thermal intermediate structure 24 and the plurality of carbon nanotubes and organic moieties which form thermal intermediate structure 24 may all be characterized as "modules" herein. Such modules may include hardware circuitry, and/or a processor and/or memory circuits, software program modules and objects, and/or firmware, and combinations thereof, as desired by the architect of the apparatus 10 and system 800, and as appropriate for particular implementations of various embodiments. For example, such modules may be included in a system operations simulation package, such as a software electrical signal simulation package, a power usage and distribution simulation package, a thermo-mechanical stress simulation package, a power/heat dissipation simulation package, and/or a combination of software and hardware used to simulate the operation of various potential embodiments.

It should also be understood that the apparatus and systems of various embodiments can be used in applications other than for coupling and heat transfer between dice and heat sinks and thus, these embodiments are not to be so limited. The illustrations of apparatus 10 and system 700 are intended to provide a general understanding of the elements and structure of various embodiments, and they are not intended to serve as a complete description of all the features of compositions, apparatus, and systems that might make use of the elements and structures described herein.

Applications that may include the novel apparatus and systems of various embodiments include electronic circuitry used in high-speed computers, communication and signal processing circuitry, data transceivers, modems, processor modules, embedded processors, and application-specific modules, including multilayer, multi-chip modules. Such apparatus and systems may further be included as sub-components within a variety of electronic systems, such as televisions, cellular telephones, personal computers, workstations, radios, video players, vehicles, and others.

It should be noted that the methods described herein do not have to be executed in the order described, or in any particular order. Moreover, various activities described with respect to the methods identified herein can be executed in serial or parallel fashion.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. It is to be understood that the above description has been made in an illustrative fashion, and not a restrictive one. Combinations of the above embodiments, and other embodiments not specifically described herein will be apparent to those of skill in the art upon reviewing the above description. Thus, the scope of various embodiments includes any other applications in which the above compositions, structures, and methods are used.

It is emphasized that the Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment. In the appended claims, the terms "including" and "in which" are used as the plain-English equivalents of the respective terms "comprising" and "wherein," respectively. Moreover, the terms "first," "second," and "third," etc. are used merely as labels, and are not intended to impose numerical requirements on their objects.

What is claimed is:

1. A method, comprising:
   oxidizing at least one nanotube rope in acid to cut it into short nanotubes with open ends having carboxyl linkages attached thereto;
   forming organic moieties at the open ends;
   tethering an end of the short nanotubes to a surface of a first object; and
   placing a surface of a second object in contact with another end of the short nanotubes to form a thermal path between the surface of the first object and the surface of the second object.

2. The method of claim 1 wherein the first object is an electronic circuit die and the second object is a heat sink.

3. The method of claim 1 wherein the first object is a heat sink and the second object is an electronic circuit die.

4. The method of claim 1 wherein the organic moieties comprise an amide linker.

5. The method of claim 4 wherein the organic moieties also comprise a thiol linker.

* * * * *